United States Patent
Song et al.

(10) Patent No.: US 9,173,333 B2
(45) Date of Patent: Oct. 27, 2015

(54) SHIELDING STRUCTURES INCLUDING FREQUENCY SELECTIVE SURFACES

(71) Applicants: John Song, Barrington, IL (US); Paul Francis Dixon, Sharon, MA (US)

(72) Inventors: John Song, Barrington, IL (US); Paul Francis Dixon, Sharon, MA (US)

(73) Assignee: LAIRD TECHNOLOGIES, INC., Earth City, MO (US)

( * ) Notice: Subject to any disclaimer, the term of this patent is extended or adjusted under 35 U.S.C. 154(b) by 413 days.

(21) Appl. No.: 13/750,680

(22) Filed: Jan. 25, 2013

(65) Prior Publication Data

US 2014/0209373 A1 Jul. 31, 2014

(51) Int. Cl.
*H01Q 17/00* (2006.01)
*H05K 9/00* (2006.01)
*H05K 1/02* (2006.01)

(52) U.S. Cl.
CPC ............ *H05K 9/0022* (2013.01); *H05K 1/0236* (2013.01); *H05K 1/024* (2013.01); *H05K 1/0234* (2013.01); *H05K 1/0272* (2013.01); *H05K 2201/0723* (2013.01); *H05K 2201/09063* (2013.01); *H05K 2203/1178* (2013.01); *Y10T 29/49016* (2015.01)

(58) Field of Classification Search
CPC ... H05K 9/0022; H05K 1/0236; H05K 1/024; H05K 1/0272; H05K 2201/0723; H05K 2203/1178; H05K 2201/09063; H05K 1/0234; Y10T 29/49016
USPC ............ 342/1–11, 13–15, 175; 174/388, 350; 29/600
See application file for complete search history.

(56) References Cited

U.S. PATENT DOCUMENTS

| | | | |
|---|---|---|---|
| 5,276,277 A * | 1/1994 | Hightower et al. | 174/376 |
| 6,218,978 B1 * | 4/2001 | Simpkin et al. | 342/5 |
| 6,870,092 B2 | 3/2005 | Lambert et al. | |
| 7,030,463 B1 * | 4/2006 | Subramanyam et al. | 257/595 |
| 7,038,124 B1 | 5/2006 | Sosnowski | |
| 7,135,643 B2 | 11/2006 | van Haaster et al. | |
| 7,608,326 B2 | 10/2009 | Johnson | |
| RE41,594 E | 8/2010 | Lambert et al. | |
| RE42,512 E | 7/2011 | Lambert et al. | |
| 8,018,375 B1 * | 9/2011 | Alexopoulos et al. | 342/175 |
| 8,138,673 B1 * | 3/2012 | Wedding | 313/582 |

(Continued)

FOREIGN PATENT DOCUMENTS

| | | | |
|---|---|---|---|
| EP | 2148386 A1 * | 1/2010 | |
| EP | 2573864 A1 * | 3/2013 | |

(Continued)

OTHER PUBLICATIONS

86250 Nickel/Copper Black Fabric Tape; www.lairdtech.com; © 2012; 2 pgs.

(Continued)

*Primary Examiner* — John B Sotomayor
(74) *Attorney, Agent, or Firm* — Harness, Dickey & Pierce, P.L.C.

(57) ABSTRACT

According to various aspects, exemplary embodiments are disclosed of shielding structures including one or more frequency selective surfaces, which may be used for attenuating, reflecting, and/or redirecting electromagnetic signals through open structures. Also disclosed are methods of using one or more frequency selective surfaces for attenuating, reflecting, and/or redirecting electromagnetic signals through open structures.

23 Claims, 5 Drawing Sheets

(56) References Cited

U.S. PATENT DOCUMENTS

| | | | |
|---|---|---|---|
| 8,643,532 B1* | 2/2014 | Puscasu et al. | 342/4 |
| 2007/0042819 A1 | 2/2007 | Li et al. | |
| 2007/0095567 A1 | 5/2007 | Boyce et al. | |
| 2007/0222658 A1* | 9/2007 | Puscasu et al. | 342/1 |
| 2008/0055023 A1* | 3/2008 | Gevorgian et al. | 333/235 |
| 2010/0097048 A1* | 4/2010 | Werner et al. | 324/76.11 |
| 2011/0304005 A1* | 12/2011 | Brueckl et al. | 257/467 |
| 2012/0062346 A1* | 3/2012 | McKinzie, III | 333/251 |
| 2012/0086463 A1* | 4/2012 | Boybay et al. | 324/612 |
| 2012/0098628 A1* | 4/2012 | Batchelor et al. | 333/24 C |
| 2012/0119932 A1* | 5/2012 | MacDonald et al. | 342/1 |
| 2012/0281360 A1 | 11/2012 | Nicol et al. | |
| 2014/0111364 A1* | 4/2014 | Sjolund | 342/3 |
| 2014/0125506 A1* | 5/2014 | Sjolund | 342/3 |
| 2014/0209373 A1* | 7/2014 | Song et al. | 174/388 |
| 2014/0209374 A1* | 7/2014 | Song et al. | 174/388 |

FOREIGN PATENT DOCUMENTS

| | | | | |
|---|---|---|---|---|
| JP | 2011-176255 | | 9/2011 | |
| KR | 10-2012-0050391 | | 5/2012 | |
| KR | 10-2012-0072018 | | 7/2012 | |
| WO | WO 2007051487 A1 * | | 5/2007 | H01Q 3/46 |

OTHER PUBLICATIONS

Emerson & Cumings; http://www.eccosorb.com/Collateral/Documents/English-US/ANW.pdf; May 11, 2007; 2 pgs.

Design of Metamaterial-Based Resonant Microwave Absorbers with Reduced Thickness and Absence of a Metallic Backing; F. Bilotti and L. Vegni; 2009; http://xa.yimg.com/kq/groups/13354653/361229153/name/fulltext(5).pdf; 10 pgs.

"Everything You Ever Wanted to Know About Frequency-Selective Surface Filters but Were Afraid to Ask", B. Hooberman•, May 2005; 22 pgs.; http://calvin.phys.columbia.edu/group_web/filter_development/download/filter.pdf.

International Search Report and Written Opinion dated May 14, 2014 for PCT Application No. PCT/US2014/012551 filed Jan. 22, 2014 which claims priority to the instant application; 11 pages.

Eccosorb® BSR; http://www.eccosorb.com/Collateral/Documents/English-US/Cavity%20Resonance%20IEE%20Article.pdf; Oct. 8, 2008; 1 pg.

Dampening Cavity Resonance Using Absorber Material; P. Dixon; May 2004; 3 pgs. http://www.eccosorb.com/Collateral/Documents/English-US/BSR.pdf.

Cavity-Resonance Dampening; P. Dixon; Jun. 2005; 7 pgs. http://www.eccosorb.com/Collateral/Documents/English-US/SF.pdf.

* cited by examiner ing and/or reflecting and/or redirecting EMI energy. Traditional shielding methods and materials rely on an electrically conductive surface completely enclosing a source of electromagnetic radiation. In reality, however, some gaps in the electrically conductive surface must remain to allow instrument egress and to allow airflow, which gaps will allow signal leakage. Electromagnetic absorbent material may be used to attenuate the signal leakage through a gap. But the absorber must completely cover the gap in order to be effective. In which case, the absorber inhibits or prevents equipment

SHIELDING STRUCTURES INCLUDING FREQUENCY SELECTIVE SURFACES

FIELD

The present disclosure relates to shielding structures including frequency selective surfaces, which may be used for attenuating electromagnetic signals through open or closed structures.

BACKGROUND

This section provides background information related to the present disclosure which is not necessarily prior art.

The operation of electronic devices generates electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments are disclosed of shielding structures including one or more frequency selective surfaces, which may be used for attenuating, reflecting, and/or redirecting electromagnetic signals through open structures. Also disclosed are methods of using one or more frequency selective surfaces for attenuating, reflecting, and/or redirecting electromagnetic signals through open structures.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 illustrates a printed circuit board (PCB) having an integrated circuit, a frequency selective surface/period structure within the PCB, and a frequency selective surface/period structure applied or disposed over the integrated circuit whereby the frequency selective surfaces are operable for providing shielding to the integrated circuit according to exemplary embodiments.

FIG. 2 illustrates an exemplary embodiment of a frequency selective surface that may be used as a single band or multi-band bandstop waveguide and/or shielding structure, where the frequency selective surface may include any suitable number of suitably configured (e.g., shaped and sized, etc.) electrically-conductive, electromagnetic energy absorbing, and/or magnetic members (e.g., rings and/or other configurations, etc.) as represented by the series of dots.

Figure 8:
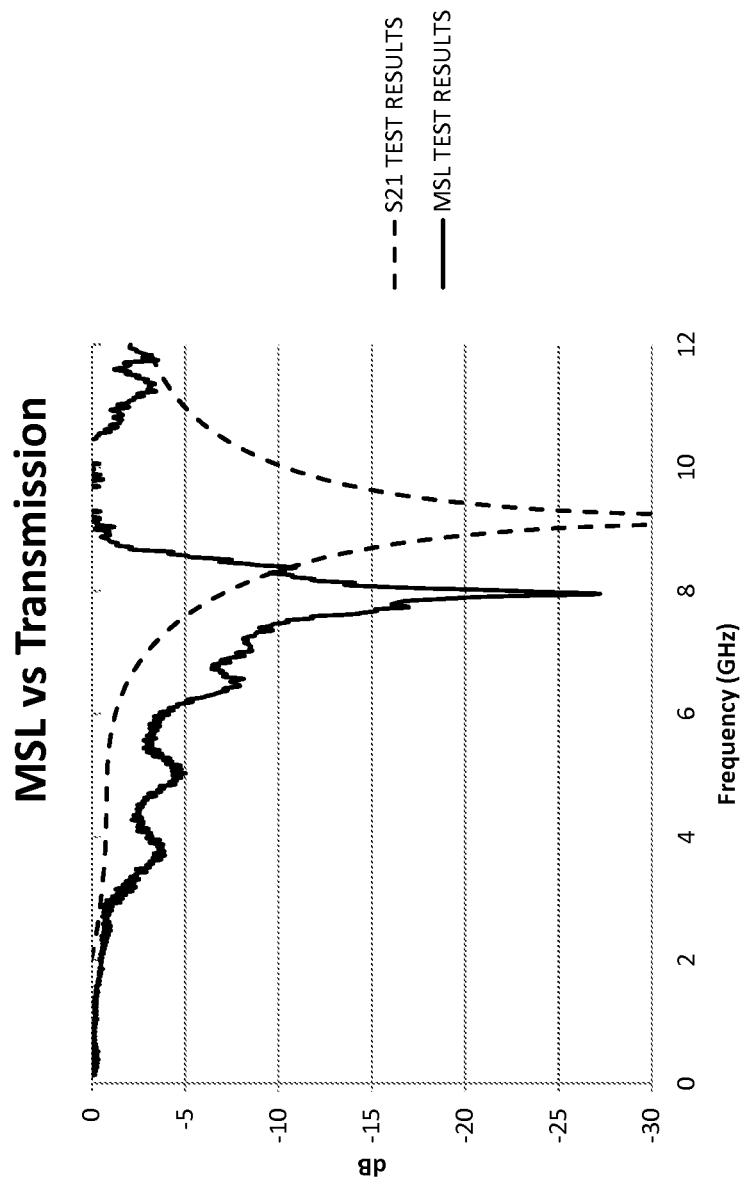

FIG. 8 is an exemplary line graph showing signal strength in decibels (dB) versus frequency in gigahertz (GHz) for first and second tests (referred to as S21 and MSL tests) in which reference signals between two antennas pointed at each other were recorded with and without an exemplary embodiment of a frequency selective surface therebetween to show bandstop capabilities of the frequency selective surface.

DETAILED DESCRIPTION

Example embodiments will now be described more fully with reference to the accompanying drawings.

As explained above in the background, shields are commonly used to ameliorate the effects of EMI/RFI by absorbing and/or reflecting and/or redirecting EMI energy. Traditional shielding methods and materials rely on an electrically conductive surface completely enclosing a source of electromagnetic radiation. In reality, however, some gaps in the electrically conductive surface must remain to allow instrument egress and to allow airflow, which gaps will allow signal leakage. Electromagnetic absorbent material may be used to attenuate the signal leakage through a gap. But the absorber must completely cover the gap in order to be effective. In which case, the absorber inhibits or prevents equipment access or airflow, which is often not feasible as sometimes equipment access and/or or airflow must be maintained.

After recognizing the above, the inventors developed the disclosed exemplary embodiments of single band or multi-band bandstop waveguide and/or shielding structures using or including one or more frequency selective surfaces/periodic structures. Also disclosed herein are exemplary methods for attenuating electromagnetic signals through open or closed structures by using one or more frequency selective surfaces/periodic structures. The inventors have recognized the advantages in using frequency selective surfaces for shielding purposes in that frequency selective surfaces may be installed within open structures for attenuating (e.g., reflecting, blocking, redirecting, and/or absorbing, etc.) electromagnetic signals through the open structures without preventing objects and airflow to pass through the open structures.

A frequency selective surface is a passive electromagnetic sheet that is designed to block, reflect, absorb, and/or redirect electromagnetic energy over one or more specific frequency bands using electrically-conductive and/or electromagnetic energy absorbing material in patterns, which may be located on a dielectric substrate. The bandstop properties exist even at very large angles of incidence, e.g., glancing or grazing angles at which the electromagnetic signals are traveling nearly parallel to the frequency selective surface. As disclosed herein, exemplary embodiments are disclosed in which one or more frequency selective surfaces are operable for reflecting, blocking, redirecting, and/or absorbing electromagnetic signals which propagate through a channel, waveguide structure, vent panel, or other open structure, while still allowing egress of equipment and/or the passage of airflow.

Figure 1:
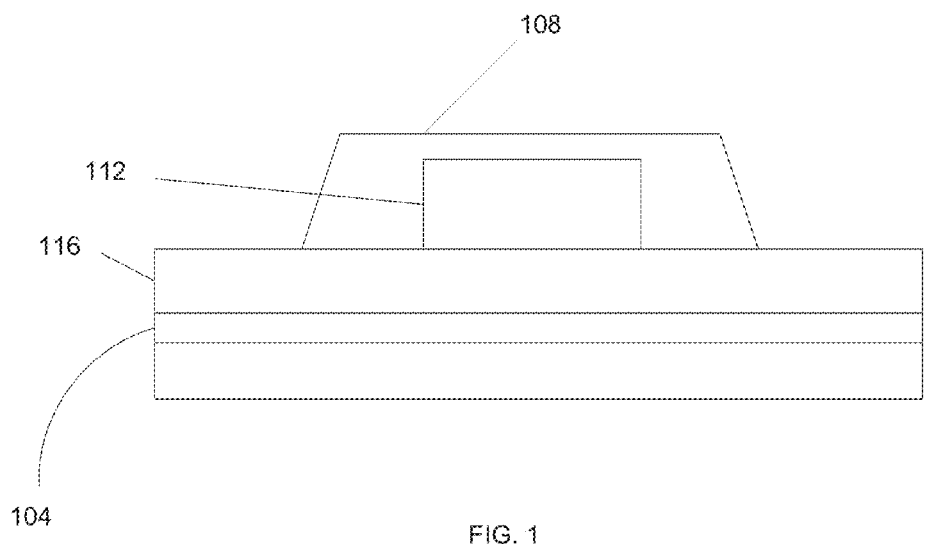

With reference now to the figures, FIG. 1 illustrates an exemplary embodiment including a single band or multiband bandstop waveguide and/or shielding structure embodying one or more aspects of the present disclosure. This illustrated embodiment comprises first and second frequency selective surfaces or periodic structures 104, 108 operable for providing shielding for an integrated circuited 112 on a printed circuit board (PCB) 116. The first frequency selective surface 104 is within the PCB 116. The second frequency selective surface 108 is positioned, applied, or disposed over the integrated circuit 112. The frequency selective surfaces 104, 108 are operable for attenuating (e.g., reflecting, blocking, redirecting, and/or absorbing, etc.) electromagnetic signals to/from the integrated circuit 112.

The frequency selective surfaces 104, 108 include electrically-conductive and/or electromagnetic energy absorbing material or members in the same or different pattern (e.g., spaced apart electrically-conductive rings, etc.) for blocking, reflecting, redirecting, and/or absorbing electromagnetic energy over one or more specific frequency bands. The electrically-conductive and/or electromagnetic energy absorbing material may be in a pattern relative to a dielectric (e.g., a dielectric substrate, air, etc.). For example, the electrically-conductive and/or electromagnetic energy absorbing material may be on a top and/or bottom surface of a dielectric substrate and/or within the dielectric substrate. As another example, dielectric members may support, suspend, and/or retain electrically-conductive and/or electromagnetic energy absorbing members at spaced apart locations from each other in a pattern. In this example, the frequency selective surface may not include any dielectric substrate as the electrically-conductive and/or electromagnetic energy absorbing members may instead be suspended, e.g., in air, by the dielectric members.

In exemplary embodiments that include more than one frequency selective surface, the frequency selective surfaces may be identical to each other or different from each other. In addition, a frequency selective surface may include any suitable number of electrically-conductive and/or electromagnetic energy absorbing members that all have the same configuration (e.g., same shape, same size, same pattern, etc.) or that do not all have the same configuration (e.g., different shape, different size, different pattern, etc.). For example, a frequency selective surface may have electrically-conductive and/or electromagnetic energy absorbing members that are shaped differently and/or sized differently to work at multiple frequencies and/or over a broader bandwidth.

Figure 2:
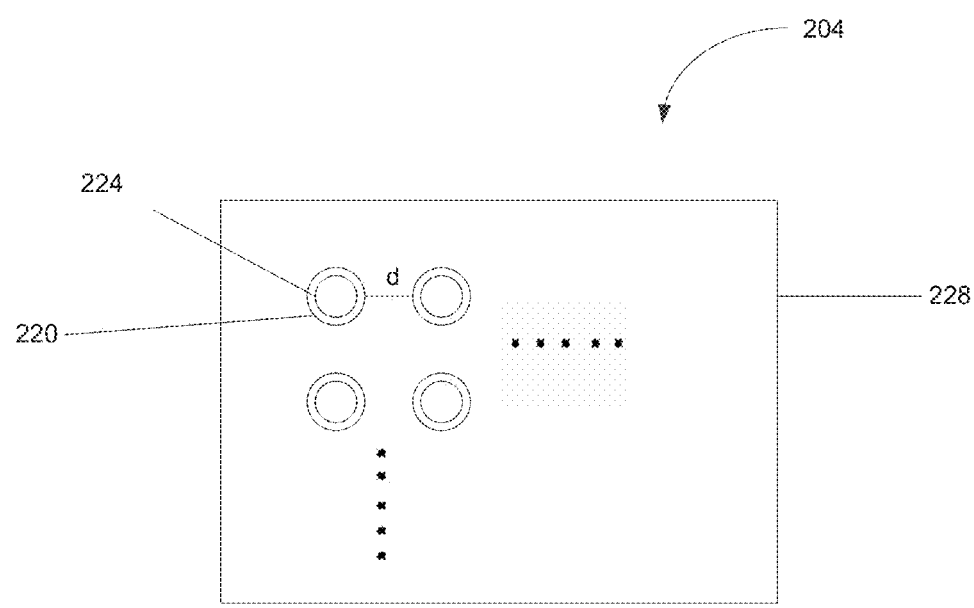
Figure 3:
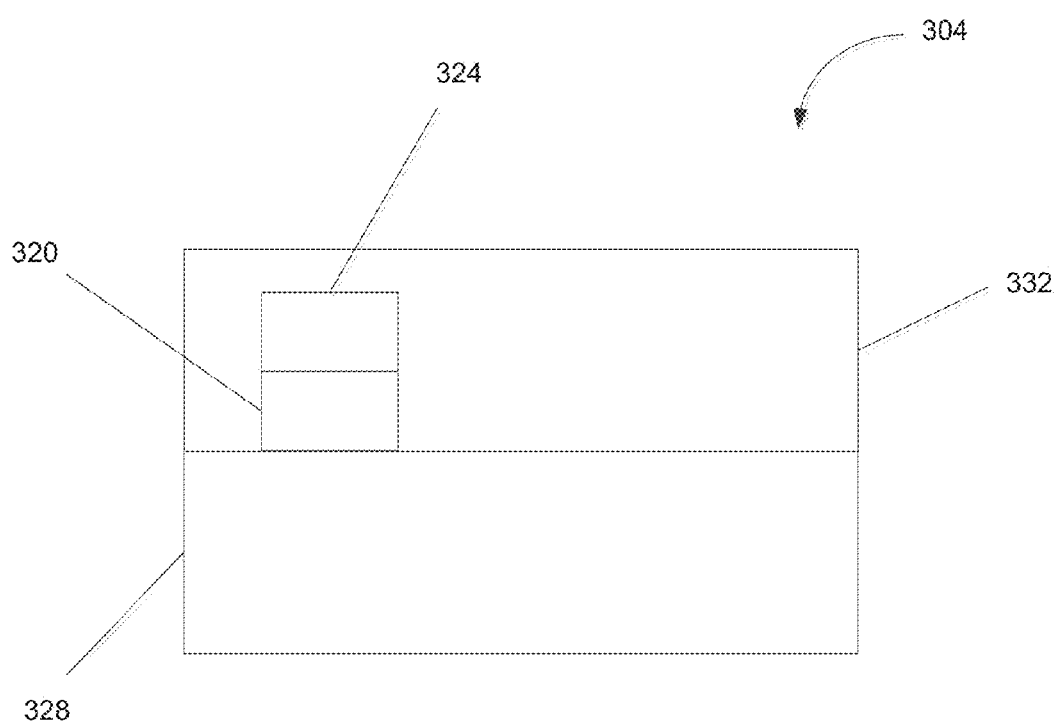
FIG. 3 illustrates an exemplary embodiment of a frequency selective surface that may be used as a single band or multi-band bandstop waveguide and/or shielding structure, where the frequency selective surface includes electromagnetic energy absorptive material applied to electrically-conductive material, which is within dielectric material.
Figure 5:
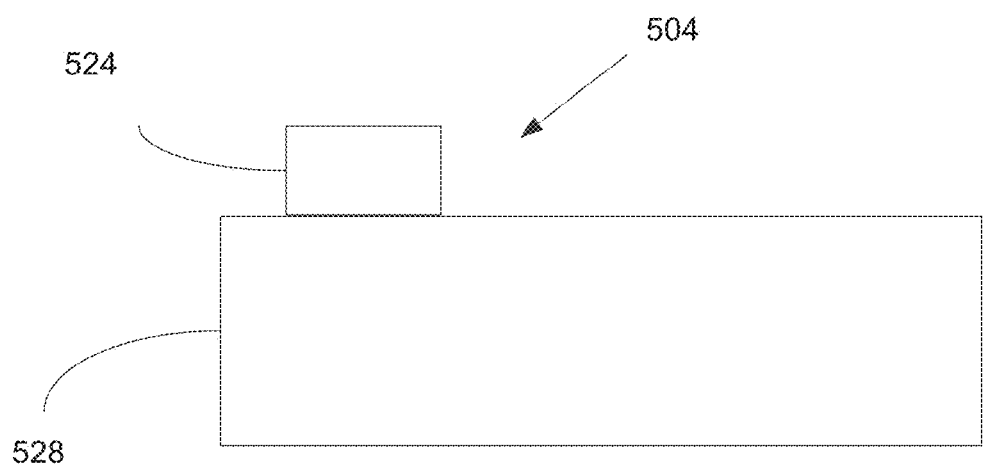
FIG. 5 illustrates an exemplary embodiment of a frequency selective surface that may be used as a single band or multi-band bandstop waveguide and/or shielding structure, where the frequency selective surface includes a dielectric and electromagnetic energy absorptive material on a surface of the dielectric.
Figure 6:
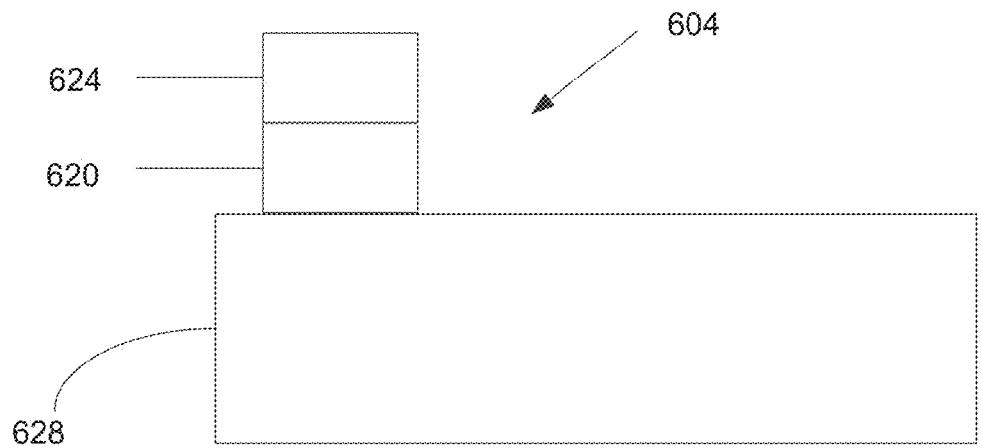
FIG. 6 illustrates an exemplary embodiment of a frequency selective surface that may be used as a single band or multi-band bandstop waveguide and/or shielding structure, where the frequency selective surface includes a dielectric and electromagnetic energy absorptive material applied to electrically-conductive material on a surface of the dielectric.

In some exemplary embodiments, a frequency selective surface may have electromagnetic energy absorbing material(s) or absorber(s) on or coupled to electrically-conductive material(s) or conductor(s), such as shown in FIGS. 2, 3, and 6. For example, an electromagnetic energy absorbing material(s) or absorber(s) may be stacked on top of the electrically-conductive material(s) or conductor(s). Or, for example, an electromagnetic energy absorbing thin film(s) may be disposed over and attached to the electrically-conductive material(s) or conductor(s). As yet another example, the electrically-conductive material(s) or conductor(s) may be coated with one or more electromagnetic energy absorbing coatings. In other exemplary embodiments, a frequency selective surface includes only electromagnetic energy absorbing material(s) or absorber(s) only (e.g., FIG. 5, etc.) or only electrically-conductive material(s) or conductor(s) (e.g., FIG. 4, etc.). In still other exemplary embodiments, a frequency selective surface includes electromagnetic energy absorbing material(s) or absorber(s) that are adjacent or alongside, but not stacked on top of, the electrically-conductive material(s) or conductor(s).

The illustrated embodiment of FIG. 1 includes the first and second frequency selective surfaces 104, 108, which are respectively within the PCB 116 and disposed over the integrated circuit 112. Alternative exemplary embodiments may include more or less than two frequency selective surfaces. For example, other exemplary embodiments include either a first frequency selective surface within a PCB substrate or a second frequency selective surface disposed over an integrated circuit on the PCB, but not both. Additional exemplary embodiments include a frequency selective surface on the top surface and/or bottom surface of the PCB substrate, without any frequency selective surface within the PCB substrate or disposed over an integrated circuit on the substrate. Further exemplary embodiments include more than two frequency selective surfaces, such as a first frequency selective surface within the PCB substrate, a second frequency selective surface disposed over an integrated circuit on the PCB, and a third frequency selective surface on the top or bottom surface of the PCB substrate. Still further exemplary embodiments include a first frequency selective surface within the PCB substrate, a second frequency selective surface disposed over an integrated circuit on the PCB, a third frequency selective surface on the top surface of the PCB substrate, and a fourth frequency selective surface on the bottom surface of the PCB substrate. Additionally, or alternatively, a frequency selective surface may placed on another surface in the vicinity of an EMI noise path instead of, or in addition to, placement of a frequency selective surface on a circuit, within a PCB, and/or on a surface of a PCB (e.g., underneath, etc.).

FIG. 2 illustrates an exemplary embodiment of a frequency selective surface or periodic structure 204 that may be used as a single band or multiband bandstop waveguide and/or shielding structure. As represented by the series of dots and distance (d) in FIG. 2, the frequency selective surface 204 (and other frequency selective surfaces disclosed herein) may include any suitable number of suitably configured (e.g., shaped, sized, spaced apart, patterned, etc.) electrically-conductive and/or electromagnetic energy absorbing members (e.g., rings and/or other shapes, etc.) depending, for example, on what frequency or frequencies are to be reflected, absorbed, blocked, and/or redirected by the frequency selective surface 204. The frequency selective surface 204 may be designed, configured, or tuned to reflect, absorb, block, and/or redirect energy at one or more desired frequencies or frequency bandwidths (e.g., about 9 Gigahertz, etc.).

In this example, the frequency selective surface 204 includes electrically-conductive material or conductors 220 and electromagnetic energy absorbing material or absorbers 224 on or applied to the electrically-conductive material or conductors 220. FIG. 2 also illustrates a dielectric 228, which may comprise any suitable dielectric including dielectric substrate materials, air, etc. In operation, the frequency selective surface 204 reflects, absorbs, blocks, and/or redirects signals at near glancing incidence (90 degrees off normal) to stop energy while also allowing other objects and airflow through.

FIG. 3 illustrates an exemplary embodiment of a frequency selective surface 304 that may be used as a single band or multiband bandstop waveguide and/or shielding structure. As shown in FIG. 3, an electromagnetic energy absorptive material or absorber 324 is on or applied to electrically-conductive material or electrical conductor 320. During use, the electromagnetic energy absorbing material 324 is operable for attenuating or absorbing electromagnetic signals reflected by the frequency selective surface 304. Although FIG. 3 only illustrates a single electrical conductor 320 and single absorber 324 thereon, the frequency selective surface 304 may include any suitable number of suitably configured (e.g., shaped, sized, spaced apart, patterned, etc.) electrical conductors 320 and absorbers 324 (e.g., rings and/or other shapes, etc.) depending, for example, on what frequency or frequencies are to be reflected by the frequency selective surface 304.

FIG. 3 also illustrates dielectrics 328 and 332. The dielectrics 328, 332 may comprise portions of the same dielectric, e.g., upper and lower portions of the same dielectric substrate. Or the dielectrics 328, 332 may comprise different dielectrics. For example, the dielectric 328 may be a dielectric substrate while the dielectric 332 may comprise air.

Figure 4:
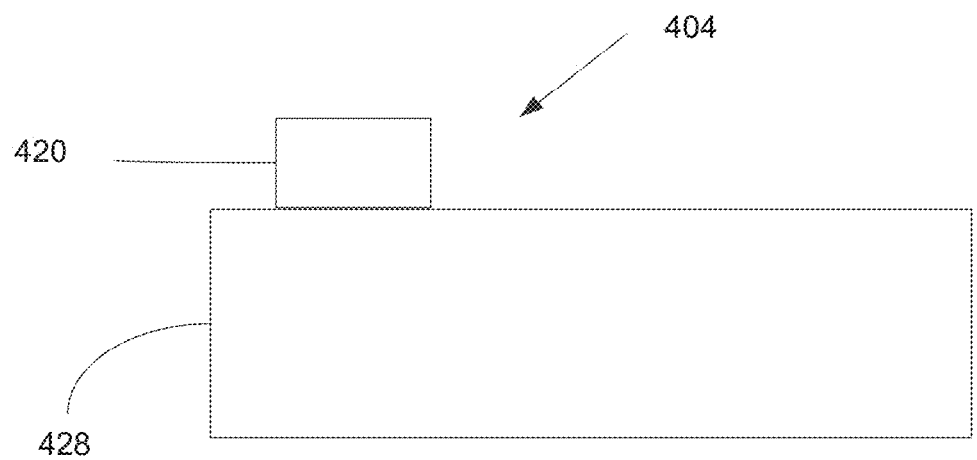
FIG. 4 illustrates an exemplary embodiment of a frequency selective surface that may be used as a single band or multi-band bandstop waveguide and/or shielding structure, where the frequency selective surface includes a dielectric and electrically-conductive material on a surface of the dielectric.

FIG. 4 illustrates an exemplary embodiment of a frequency selective surface 404 that may be used as a single band or multiband bandstop waveguide and/or shielding structure. As shown in FIG. 4, the frequency selective surface 404 includes an electrically-conductive material or electrical conductor 420 on a surface of a dielectric 428. Although FIG. 4 only illustrates a single electrical conductor 420, the frequency selective surface 404 may include any suitable number of suitably configured (e.g., shaped, sized, spaced apart, patterned, etc.) electrical conductors depending, for example, on what frequency or frequencies are to be reflected by the frequency selective surface 404.

FIG. 5 illustrates an exemplary embodiment of a frequency selective surface 504 that may be used as a single band or multiband bandstop waveguide and/or shielding structure. As shown in FIG. 5, the frequency selective surface 504 includes an electromagnetic energy absorptive material or absorber 520 on a surface of a dielectric 528. Although FIG. 5 only illustrates a single absorber 520, the frequency selective surface 504 may include any suitable number of suitably configured (e.g., shaped, sized, spaced apart, patterned, etc.) absorbers 520 depending, for example, on what frequency or frequencies are to be reflected by the frequency selective surface 504.

FIG. 6 illustrates an exemplary embodiment of a frequency selective surface 604 that may be used as a single band or multiband bandstop waveguide and/or shielding structure. As shown in FIG. 6, the frequency selective surface 604 includes an electromagnetic energy absorptive material or absorber 624 on or applied to an electrically-conductive material or conductor 620, which, in turn, is on a surface of a dielectric 628. In an alternative embodiment, the positioning of the electromagnetic energy absorptive material or absorber 624 and electrically-conductive material or conductor 620 may be reversed, such that the electrically-conductive material or conductor 620 is on or applied to an electromagnetic energy absorptive material or absorber 624. Although FIG. 6 only illustrates a single electrical conductor 620 and single absorber 624 thereon, the frequency selective surface 604 may include any suitable number of suitably configured (e.g., shaped, sized, spaced apart, patterned, etc.) electrical conductors 620 and absorbers 624 (e.g., rings and/or other shapes, etc.) depending, for example, on what frequency or frequencies are to be reflected by the frequency selective surface 604.

Figure 7:
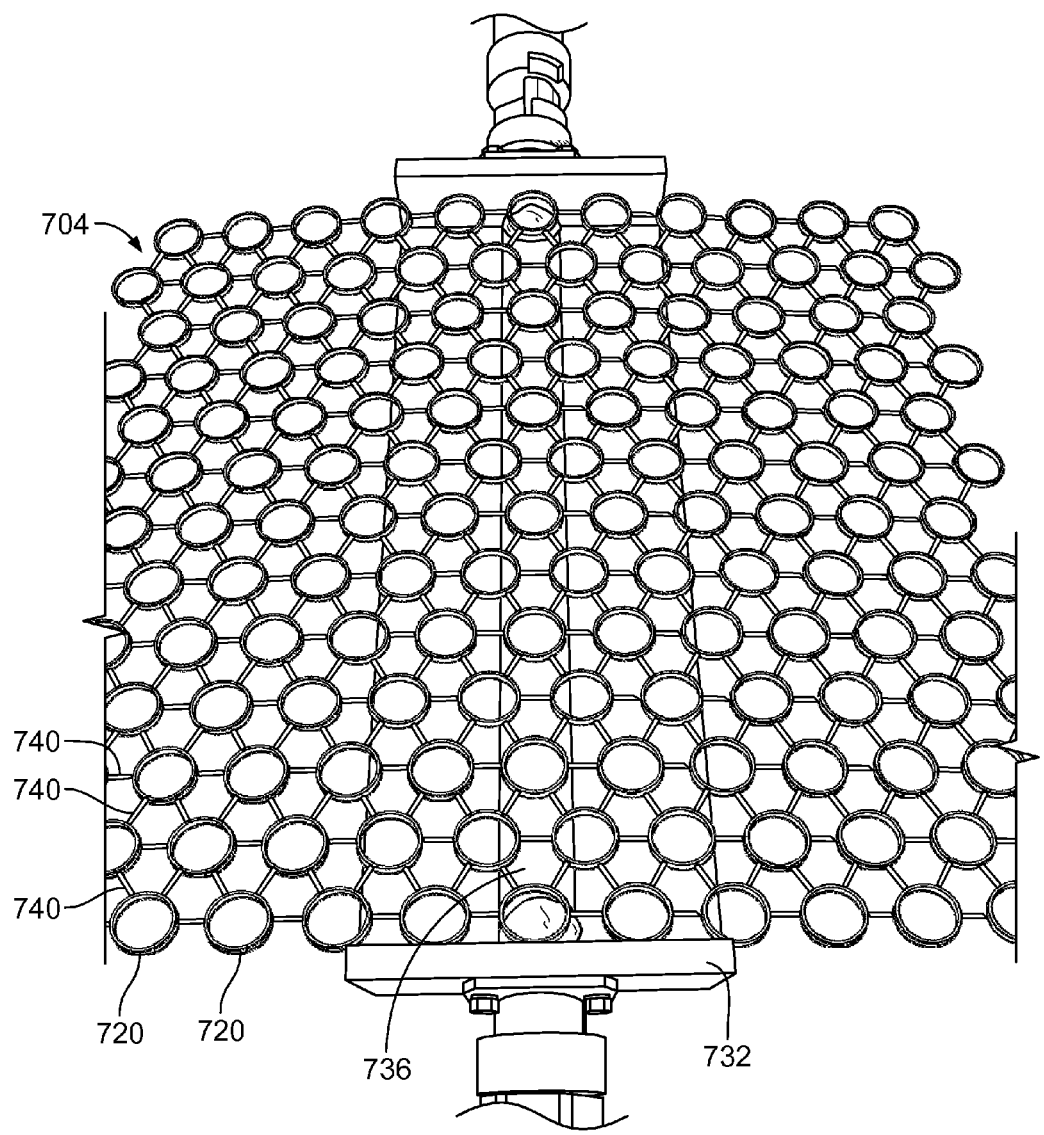
FIG. 7 illustrates an exemplary embodiment of a frequency selective surface having dielectric members and electrically-conductive rings supported by and spaced apart from each other at specific locations by the dielectric members, where the frequency selective surface is shown within a test fixture on a microstrip line for an MSL test for which the results are shown in FIG. 8.

FIG. 7 illustrates an example frequency selective surface 704 within a test fixture 732 and placed on a microstrip line 736 for MSL testing where the results are shown in FIG. 8 and described below. As shown in FIG. 7, the frequency selective surface 704 includes a plurality of electrically-conductive and/or electromagnetic energy absorptive members and a plurality of dielectric members, struts, or spacers 740. The dielectric members 740 are connected to and extend between pairs of electrically-conductive and/or electromagnetic energy absorptive members 720. In this example, the frequency selective surface 704 does not include a dielectric substrate as the electrically-conductive members and/or electromagnetic energy absorbing members 720 are instead suspended, e.g., in air, and held in place by the dielectric members 740.

In this illustrated embodiment, the electrically-conductive members and/or electromagnetic energy absorbing members 720 are circular rings. The plurality of dielectric members 740 are linear or straight members each of which is connected between a corresponding pair of the electrically-conductive and/or electromagnetic energy absorptive rings. The electrically-conductive members and/or electromagnetic energy absorbing members 720 are at the vertices of equilateral triangles defined by the dielectric members 740.

Continuing with this example shown in FIG. 7, the electrically-conductive members and/or electromagnetic energy absorbing members 720 may have a ring inner diameter of about 10.2 millimeters (mm) and a ring outer diameter of about 12 mm. The centers of the rings may be separated by about 17.5 mm in a hexagonal pattern. Any three adjacent rings form an equilateral triangle with sides equal to about 17.5 mm. The thickness may be about 1 mm. The dimensions provided in this paragraph are examples only.

The configuration shown in FIG. 7 is but one example of a possible frequency selective surface that may be used in an exemplary embodiment as other exemplary embodiments may include one or more frequency selective surfaces tuned to different frequencies by varying the shape, size, distance of separation, overall geometric layout, etc. of the dielectric members and/or of the electrically-conductive and/or electromagnetic energy absorbing members. Other layouts or geometries may be used for the frequency selective surface 704, such as electrically-conductive and/or electromagnetic energy absorptive members in a greater or lesser number, that are spaced apart differently (e.g., closer or farther away from each other), and/or that have different shapes, etc. For example, the electrically-conductive and/or electromagnetic energy absorbing members 720 may be non-circular, e.g., triangular, rectangular, pentagonal, hexagonal, spirals, crosses, etc. In addition, the dielectric members 740 may be non-linear and/or arranged differently to define other shapes besides the equilateral triangles or hexagonal patterns shown in FIG. 7.

FIG. 8 is an exemplary line graph showing signal strength in decibels (dB) versus frequency in gigahertz (GHz) for two different tests. During the two tests, reference signals between two antennas pointed at each other was measured or recorded with and without an exemplary embodiment of a frequency selective surface therebetween. The results show bandstop capabilities of the frequency selective surface. These test results shown in FIG. 8 are provided only for purposes of illustration and not for purposes of limitation.

For the first test (called S21), the reference signal was measured or recorded between two antennas pointed at each other. Then, a frequency selective surface was inserted or positioned between the two antennas, and the reference signal is measured or recorded again. In FIG. 8, the S21 test results represent the measurements taken when the frequency selective surface was between the two antennas.

Generally, the S21 test results show that the frequency selective surface blocks, reflects, redirects, and/or absorbs energy at frequencies around 9 GHz. The level of band stoppage was better than 30 dB, which means the signal that got through was at 1/1000th the level of the reference signal. These test results show that this exemplary embodiment including the frequency selective surface had significant bandstop capabilities at around 9 GHz. Although FIG. 8 shows that this example embodiment including the frequency selective surface blocks energy at frequencies around 9 GHz, other exemplary embodiments may include one or more frequency selective surfaces that are tuned to stop energy at other suitable frequency or frequencies.

The second test (called microstrip line (MSL) test) is performed on a microstrip line. The reference measurement is taken with an empty fixture. Then, a frequency selective surface 704 is placed on the upper conductor of the microstrip line 736 as shown in FIG. 7 and the signal is measured. The MSL test results in FIG. 8 show significant bandstop capabilities (e.g., level of band stoppage more than 25 dB) at around 8 GHz. Generally, the MSL test may be more indicative of the bandstop capabilities of a bandstop waveguide and/or shielding structure including a frequency selective surface. This is because the signal travels parallel to the frequency selective surface during the MSL testing, and the electric and magnetic fields are perpendicular to the surface or plane of the frequency selective surface. In comparison, the energy is traveling perpendicular to the surface of the frequency selective surface during the S21 testing, and the electric and magnetic fields are parallel to the surface of the frequency selective surface.

A wide range of materials may be used for the electrically-conductive members or electrical conductors (e.g., 220, 320, 420, 620, 720, etc.) in exemplary embodiments that include electrically-conductive members or electrical conductors. Example materials include metals (e.g., copper, nickel/copper, silver, etc.), electrically-conductive composite materials, etc. Some exemplary embodiments include electrically-conductive members or electrical conductors comprising electrically-conductive pressure sensitive adhesive, such as an electrically-conductive pressure sensitive adhesive available from Laird Technologies, Inc. By way of example only, an exemplary embodiment includes one or more frequency selective surfaces having electrically-conductive members made of Laird Technologies' black conductive fabric tape 86250 tape, which is a nickel/copper metallized fabric with an electrically-conductive pressure sensitive adhesive. By way of further example, another exemplary embodiment includes one or more frequency selective surfaces having electrically-conductive and/or electromagnetic energy absorptive members made of a corresponding electrically-conductive and/or electromagnetic energy absorptive pressure sensitive adhesive.

A wide range of dielectrics may also be used in exemplary embodiments disclosed herein. For example, the dielectric members (e.g., 740 (in FIG. 7) etc.) connected to electrically-conductive and/or electromagnetic energy absorptive members (e.g., 720, etc.) in exemplary embodiments may be made of plastics (e.g., acrylonitrile butadiene styrene (ABS) plastic, etc.), electrically non-conductive pressure sensitive adhesives, etc. In an exemplary embodiment, the dielectric members 740 are made of ABS plastic. In another exemplary embodiment, the dielectric members 740 are made of electrically non-conductive or dielectric pressure sensitive adhesive.

A wide range of materials may be used for a dielectric substrate (e.g., 228, 328, 428, 528, 628, etc.) in exemplary embodiments disclosed herein, such as plastics (e.g., ABS plastic, Mylar plastic, etc.), composite materials (e.g., FR4 composite material, etc.), flexible, and/or thermally conductive materials. An exemplary embodiment includes a frequency selective surface having a substrate comprising ABS plastic. Another exemplary embodiment includes a frequency selective surface having a substrate comprising FR4 composite material, which includes woven fiberglass cloth with an epoxy resin binder that is flame resistant.

In some exemplary embodiments, a frequency selective surface may be thermally conductive (e.g., have a thermal conductivity greater than air, have a thermal conductivity greater than 0.5 Watts per meter per Kelvin (w/mK), etc.) and/or flexible. By way of example, an exemplary embodiment includes a frequency selective surface having sufficient flexibility to allow it to be applied to virtually any part of a device even after the device has been designed and manufactured. For example, a frequency selective surface may be applied to or over an electronic component on a PCB post-manufacture or after the PCB and electronic component are manufactured.

In an exemplary embodiment, a flexible frequency selective surface includes electrically non-conductive or dielectric members and/or a substrate comprising ABS plastic. Also in this exemplary embodiment, the frequency selective surface includes electrically-conductive members comprising electrically-conductive pressure sensitive adhesive (e.g., Laird Technologies' black conductive fabric tape 86250 tape, etc.). In another exemplary embodiment, a flexible frequency selective surface includes electrically-conductive members comprising copper and a substrate comprising Mylar. In this example, the copper pattern is etched onto the Mylar using FR4/PCB manufacturing processes, which has the advantage of being thinner and perhaps easier to manufacture.

In some exemplary embodiments, a frequency selective surface includes electromagnetic energy absorptive material. During use, the electromagnetic energy absorptive material is operable for attenuating the electromagnetic signals reflected by the frequency selective surface. A wide range of electromagnetic energy absorptive materials may be used in some exemplary embodiments (e.g., FIG. 2, FIG. 3, FIG. 5, FIG. 6, etc.), including absorbing particles, fillers, flakes, etc. and/or made of various electrically conductive and/or magnetic materials, such as carbonyl iron, SENDUST (an alloy containing about 85% iron, 9.5% silicon and 5.5% aluminum), permalloy (an alloy containing about 20% iron and 80% nickel), iron silicide, iron-chrome compounds, metallic silver, magnetic alloys, magnetic powders, magnetic flakes, magnetic particles, nickel-based alloys and powders, chrome alloys, and any combinations thereof, etc. By way of example only, an exemplary embodiment of a frequency selective surface may include an electromagnetic energy absorptive material available from Laird Technologies, Inc. and/or as disclosed in U.S. Pat. No. 7,135,643, the entire contents of which is incorporated herein. As disclosed herein, exemplary embodiments may include electrically-conductive members or electromagnetic energy absorptive members. Additional exemplary embodiments may also include both electrically-conductive members and electromagnetic energy absorptive members, which are in a stacked arrangement (e.g., electromagnetic energy absorptive members are stacked on electrically-conductive members, or vice versa, etc.) are adjacent or abutting one another. Other exemplary embodiments may include members that are configured to be electrically-conductive and electromagnetic energy absorptive.

In some exemplary embodiments, a frequency selective surface may include a thermally conductive, electromagnetic energy absorptive material. In which case, the thermally conductive, electromagnetic energy absorptive material may be operable for attenuating the electromagnetic signals reflected by the frequency selective surface while also allowing the frequency selective surface to be used in close proximity to or in contact with (e.g., form part of a heat path, etc.) integrated circuits, other heat generating electronic components, heat sinks, etc. In an exemplary embodiment, a frequency selective surface includes thermally conductive, electromagnetic energy absorptive composite material available from Laird Technologies, Inc. and/or as disclosed in U.S. Pat. No. 7,608,326, the entire contents of which is incorporated herein.

In some exemplary embodiments, a single band or multiband bandstop waveguide and/or shielding structure having a frequency selective surface may also be configured to exhibit or have thermally conductive properties. The substrate of the frequency selective surface may be thermally conductive, e.g., have a thermal conductivity of at least 0.5 Watts per meter per Kelvin (W/mK) or more, have a thermal conductivity greater than air, etc. In an exemplary embodiment, a frequency selective surface includes substrate comprising a composite material loaded with thermally conductive filler. In exemplary embodiments in which a single band or multiband bandstop waveguide and/or shielding structure has or exhibits thermally conductive properties, the thermally conductive properties may enable the bandstop waveguide and/or shielding structure to be used in close proximity to or in contact with integrated circuits, other heat generating electronic components, heat sinks, etc. For example, a thermally conductive bandstop waveguide and/or shielding structure may be used adjacent or in contact with one or more heat generating components such that at least a portion of the thermally conductive bandstop waveguide and/or shielding structure (e.g., substrate or electrically-conductive members of the frequency selective surface, etc.) defines or includes part of a thermally conductive heat path from the one or more heat generating components to a heat sink.

In some exemplary embodiments, the flexible structure of a frequency selective surface may be incorporated in, integrated or integral with, applied, etc. on a surface, above, or inside a circuit board, such as after the regular manufacturing process. The frequency selective surface may be conformable and/or heat cured over a board in some embodiments. A frequency selective surface may be arranged normal to a board in a series in some embodiments. By way of example, a frequency selective surface may be configured to be conformable to a mating surface and/or to have stiffness and flexibility properties similar to printed circuit board substrates.

Advantageously, exemplary embodiments including frequency selective surfaces usable as single band or multiband bandstop waveguide and/or shielding structures disclosed herein may provide one or more (but not necessarily any or all) of the following advantages. For example, exemplary embodiments may provide attenuation of electromagnetic signals through open structures while allowing other objects and airflow through the open structures. A bandstop waveguide and/or shielding structure may be positioned or installed within an open structure (e.g., opening, gap, channel, etc.) such that it is operable for attenuating electromagnetic signals or energy through the open structure without preventing access to equipment or an airflow through the open structure. Accordingly, a cooling airflow may flow through the open structure and/or equipment may be accessed (e.g., for testing, repair, maintenance, replacement, etc.) via the open structure even while the bandstop waveguide and/or shielding structure remains installed or positioned within the open structure. A tool or testing device may be inserted through the opening, gap, channel, or other open structure because the installed bandstop waveguide and/or shielding structure does not completely block the opening, gap, channel, or other open structure. This is unlike some existing traditional shielding or absorbing structures that operate by completely blocking the opening, gap, channel, or other open structure in which they are installed.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two-particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A shielding structure comprising a frequency selective surface including at least a portion that is configured to be conformable to a mating surface, whereby the frequency selective surface is configured to be operable for attenuating, reflecting, and/or redirecting electromagnetic signals at one or more bandstop frequencies that are propagating through a structure without completely blocking the structure when the frequency selective surface is positioned within the structure.

2. The shielding structure of claim 1, wherein the frequency selective surface is configured to be operable for attenuating, reflecting, and/or redirecting electromagnetic signals at one or more bandstop frequencies that are propagating through an open structure while also allowing airflow through the open structure when the frequency selective surface is positioned within the open structure.

3. The shielding structure of claim 1, wherein the frequency selective surface is configured to have a thermally conductivity of at least 0.5 Watts per meter Kelvin.

4. The shielding structure of claim 1, wherein the frequency selective surface comprises a substrate that is configured to be flexible and thermally conductive.

5. The shielding structure of claim 4, wherein:
the substrate is configured to be thermally conductive and conformable to a mating surface; and
the substrate is configured to have a thermally conductivity of at least 0.5 Watts per meter Kelvin.

6. The shielding structure of claim 1, wherein the frequency selective surface comprises:
electrically-conductive members; or
electromagnetic energy absorptive members; or
electrically-conductive, electromagnetic energy absorptive members; or electrically-conductive members and electromagnetic energy absorptive members.

7. The shielding structure of claim 1, wherein the frequency selective surface comprises dielectric members and electrically-conductive and/or electromagnetic energy absorptive members on a substrate.

8. The shielding structure of claim 7, wherein:
the electrically-conductive and/or electromagnetic energy absorptive members comprise electrically-conductive pressure sensitive adhesive; and/or
the dielectric members comprise electrically non-conductive pressure sensitive adhesive or acrylonitrile butadiene styrene plastic; and/or
the substrate comprises acrylonitrile butadiene styrene plastic, Mylar plastic, or FR4 composite material including woven fiberglass cloth with an epoxy resin binder.

9. The shielding structure of claim 7, wherein:
the substrate comprises Mylar plastic; and
the electrically-conductive and/or electromagnetic energy absorptive members comprise copper etched onto the Mylar plastic.

10. The shielding structure of claim 1, wherein the frequency selective surface comprises:
electrically-conductive and/or electromagnetic energy absorptive members; and
dielectric members connected to and/or extending between corresponding pairs of the electrically-conductive and/or electromagnetic energy absorptive members that are suspended in air by dielectric members.

11. The shielding structure of claim 10, wherein:
the electrically-conductive and/or electromagnetic energy absorptive members comprise circular rings; and
the dielectric members comprise linear members each of which is connected between a corresponding pair of the circular rings; and
the electrically-conductive and/or electromagnetic energy absorptive members are at vertices of equilateral triangles defined by the dielectric members.

12. The shielding structure of claim 1, wherein the frequency selective surface comprises electrically-conductive members and electromagnetic energy absorptive material applied to the electrically-conductive members, whereby the electromagnetic energy absorptive material is configured to be operable for attenuating the electromagnetic signals reflected by the frequency selective surface.

13. The shielding structure of claim 1, wherein the frequency selective surface is tuned to have a bandstop frequency of about 9 Gigahertz, whereby the frequency selective surface is configured to be operable for reflecting, blocking, redirecting, and/or absorbing energy having a frequency of about 9 Gigahertz propagating through an open structure without completely blocking the open structure and while also allowing airflow through the open structure when the frequency selective surface is positioned within the open structure.

14. The shielding structure of claim 1, wherein the frequency selective surface is configured to have sufficient thermal conductivity for defining a thermally-conductive heat path from one or more heat generating components when positioned for providing shielding to the one or more heat generating components.

15. The shielding structure of claim 1, wherein the frequency selective surface is configured to have sufficient flexibility for application to a part of a device after manufacture of the part.

16. A shielding structure comprising a frequency selective surface including electrically-conductive and/or electromagnetic energy absorptive members and dielectric members, wherein the frequency selective surface is configured to be conformable to a mating surface.

17. The shielding structure of claim 16, wherein the electrically-conductive and/or electromagnetic energy absorptive members and dielectric members are on a substrate, and wherein:
the electrically-conductive and/or electromagnetic energy absorptive members comprise electrically-conductive pressure sensitive adhesive, the dielectric members and the substrate comprise acrylonitrile butadiene styrene plastic; or
the substrate comprises Mylar plastic, and the electrically-conductive and/or electromagnetic energy absorptive members comprise copper etched onto the Mylar plastic.

18. The shielding structure of claim 16, wherein the frequency selective surface is configured to be operable for attenuating, reflecting, and/or redirecting electromagnetic signals at one or more bandstop frequencies that are propagating through a structure without completely blocking the structure and while also allowing airflow through the structure when the frequency selective surface is positioned within the structure.

19. A method comprising positioning a frequency selective surface relative to one or more electronic components such that the frequency selective surface is operable for blocking electromagnetic signals at one or more bandstop frequencies, wherein at least a portion of the frequency selective surface is configured to be conformable to a mating surface.

20. The method of claim 19, wherein the frequency selective surface includes electrically-conductive and/or electromagnetic energy absorptive members and dielectric members on a flexible, thermally-conductive substrate.

21. The method of claim 19, wherein positioning a frequency selective surface relative to one or more electronic components comprises positioning the frequency selective surface within an open structure such that the frequency selective surface is operable for blocking electromagnetic signals at the one or more bandstop frequencies that propagate through the open structure without completely blocking the open structure and while also allowing airflow through the open structure.

22. The method of claim 19, wherein positioning a frequency selective surface relative to one or more electronic components comprises positioning the frequency selective surface to define a thermally-conductive heat path from the one or more electronic components to the frequency selective surface.

23. The method of claim 19, wherein positioning a frequency selective surface relative to one or more electronic components comprises positioning the frequency selective surface after manufacture of the one or more electronic components.

* * * * *